(12) United States Patent
Kantarovsky et al.

(10) Patent No.: US 11,316,019 B2
(45) Date of Patent: Apr. 26, 2022

(54) SYMMETRIC ARRANGEMENT OF FIELD PLATES IN SEMICONDUCTOR DEVICES

(71) Applicant: GLOBALFOUNDRIES U.S. INC., Santa Clara, CA (US)

(72) Inventors: Johnatan Avraham Kantarovsky, South Burlington, VT (US); Rajendran Krishnasamy, Essex Junction, VT (US); Siva P. Adusumilli, South Burlington, VT (US); Steven Bentley, Menands, NY (US); Michael Joseph Zierak, Colchester, VT (US); Jeonghyun Hwang, Ithaca, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 8 days.

(21) Appl. No.: 16/942,734

(22) Filed: Jul. 29, 2020

(65) Prior Publication Data
US 2022/0037482 A1 Feb. 3, 2022

(51) Int. Cl.
*H01L 29/40* (2006.01)
*H01L 29/778* (2006.01)
*H01L 29/66* (2006.01)
*H01L 29/423* (2006.01)
*H01L 29/78* (2006.01)

(52) U.S. Cl.
CPC ........ *H01L 29/404* (2013.01); *H01L 29/401* (2013.01); *H01L 29/66431* (2013.01); *H01L 29/66462* (2013.01); *H01L 29/778* (2013.01); *H01L 29/7786* (2013.01); *H01L 29/4236* (2013.01); *H01L 29/42316* (2013.01); *H01L 29/42336* (2013.01); *H01L 29/42352* (2013.01); *H01L 29/7813* (2013.01); *H01L 29/7825* (2013.01)

(58) Field of Classification Search
CPC ............ H01L 29/404; H01L 29/42336; H01L 29/42352; H01L 29/7813; H01L 29/7825; H01L 29/4236; H01L 29/66431; H01L 29/66462; H01L 29/778; H01L 29/7786
See application file for complete search history.

(56) References Cited

U.S. PATENT DOCUMENTS 7,812,369 B2    10/2010 Chini et al.
7,875,907 B2     1/2011 Honea et al.
(Continued)

FOREIGN PATENT DOCUMENTS

CN      111403480 A   *  7/2020
WO   WO-2019066878 A1  *  4/2019 ......... H03F 3/45183

*Primary Examiner* — Joseph C. Nicely
(74) *Attorney, Agent, or Firm* — David Cain

(57) ABSTRACT

The present disclosure relates generally to structures in semiconductor devices and methods of forming the same. More particularly, the present disclosure relates to semiconductor devices having field plates that are arranged symmetrically around a gate. The present disclosure provides a semiconductor device including an active region above a substrate, source and drain electrodes in contact with the active region, a gate above the active region and laterally between the source and drain electrodes, a first field plate between the source electrode and the gate, a second field plate between the drain electrode and the gate, in which the gate is spaced apart laterally and substantially equidistant from the first field plate and the second field plate.

20 Claims, 7 Drawing Sheets

(56) References Cited

U.S. PATENT DOCUMENTS

| | | |
|---|---|---|
| 8,754,496 B2 | 6/2014 | Tserng et al. |
| 8,866,191 B2 | 10/2014 | Bahat-Treidel et al. |
| 9,142,659 B2 | 9/2015 | Dora et al. |
| 2014/0361342 A1 | 12/2014 | Sriram et al. |
| 2019/0207022 A1* | 7/2019 | Nagase ................ H01L 29/513 |
| 2021/0328029 A1* | 10/2021 | Liao ..................... H01L 29/205 |

* cited by examiner

SYMMETRIC ARRANGEMENT OF FIELD PLATES IN SEMICONDUCTOR DEVICES

FIELD OF THE INVENTION

The disclosed subject matter relates generally to structures in semiconductor devices and methods of forming the same. More particularly, the present disclosure relates to semiconductor devices having field plates that are arranged symmetrically around a gate.

BACKGROUND

High power transistor switches, such as bi-directional switches, may be used in power conversion circuits in wireless communications and radar systems. The demand for high frequency and high power transmission places enormous demands on the transistors used in those applications. For example, in high power applications, it is desirable for transistors to have higher breakdown voltages between the source and the drain so as to withstand large voltages (e.g., 600-1200V). In radio-frequency applications, there is a need for transistors to achieve high linearity (i.e., degree of proportionality between the power input and the power output of a system) and low signal distortion at higher frequencies of operation.

With the semiconductor industry's drive for higher density, higher performance, and lower cost devices, there is a need to provide improved semiconductor devices that can meet the demands as described above.

SUMMARY

In an aspect of the present disclosure, there is provided a semiconductor device including an active region above a substrate, source and drain electrodes in contact with the active region, a gate above the active region and laterally between the source and drain electrodes, a first field plate between the source electrode and the gate, a second field plate between the drain electrode and the gate, in which the gate is spaced apart laterally and substantially equidistant from the first field plate and the second field plate.

In another aspect of the present disclosure, there is provided a semiconductor device including an active region above a substrate, source and drain electrodes in contact with the active region, a gate above the active region and laterally between the source and drain electrodes, a first set of field plates between the source electrode and the gate, each field plate in the first set is spaced apart from one another, a second set of field plates between the drain electrode and the gate, each field plate in the second set is spaced apart from one another. The gate is spaced apart laterally and substantially equidistant from the first set of field plates and the second set of field plates. The field plates in the first set and the field plates in the second set have upper surfaces that are substantially coplanar with an upper surface of the gate.

In yet another aspect of the present disclosure, there is provided a method of forming a semiconductor device by providing an active region above a substrate, forming a metal layer above the active region, patterning the metal layer to form a gate, a first field plate, and a second field plate, the gate being spaced apart laterally and substantially equidistant from the first field plate and the second field plate, in which the first field plate and the second field plate have upper surfaces that are substantially coplanar with an upper surface of the gate. The method also includes forming source and drain electrodes to contact the active region, in which the first field plate is between the source electrode and the gate, and the second field plate is positioned between the drain electrode and the gate.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
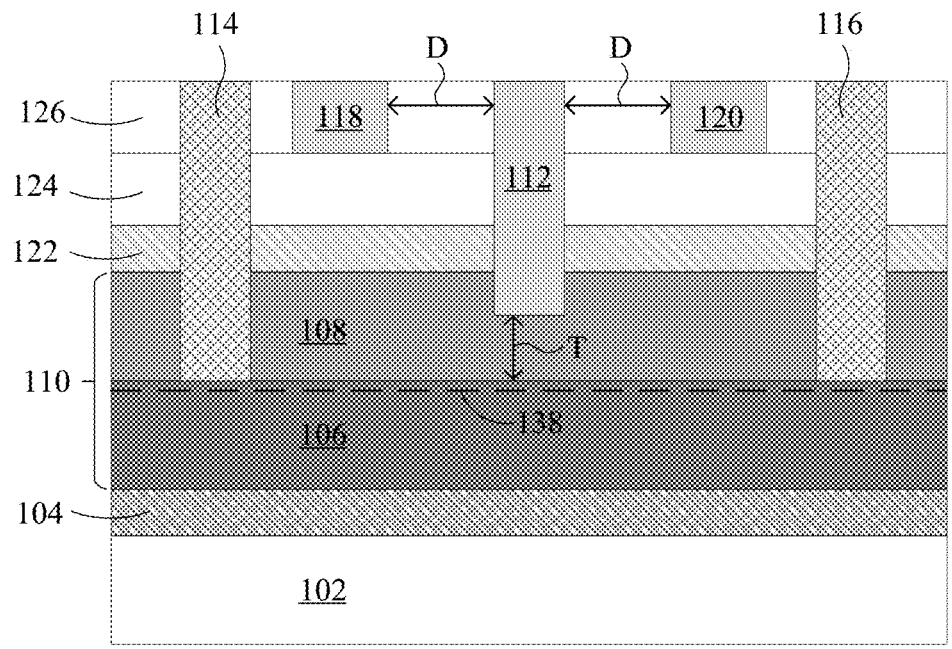
FIG. 1A through FIG. 1F are cross-sectional views of various embodiments of a semiconductor device in accordance with the present disclosure.

Referring to FIG. 1A, an embodiment of a semiconductor device includes a substrate 102, an active region 110 above the substrate 102, and a source electrode 114 and a drain electrode 116 in contact with the active region 110. As used herein, the term "active region" may refer to a region that provides a pathway for the drifting of electrical charges between the source electrode 114 and the drain electrode 116. A gate 112 is positioned above the active region 110 and laterally between the source electrode 114 and the drain electrode 116. A first field plate 118 is positioned between the source electrode 114 and the gate 112, and a second field plate 120 is positioned between the drain electrode 116 and the gate 112. The gate 112 is spaced apart laterally and substantially equidistant from the first field plate 118 and the second field plate 120.

The substrate 102 may include any semiconductor material, such as silicon, germanium, silicon germanium (SiGe), silicon carbide, and those consisting essentially of III-V compound semiconductors, such as gallium arsenide (GaAs), gallium nitride (GaN), II-VI compound semiconductors such as zinc selenide (ZnSe). Alternatively, the substrate 102 may include sapphire, spinel, zinc oxide (ZnO), aluminum nitride (AlN), or any other material capable of supporting the growth of Group III-nitride materials.

The substrate 102 may be a bulk substrate as illustrated in the accompanying drawings. In alternative embodiments (not shown), the substrate 102 may be a composite substrate structured to have multiple layers of the materials as described hereinbefore. Examples of the composite substrate may include, but not limited to, a silicon-on-ceramic substrate, Si/SiGe layered substrate, a silicon-on-insulator (SOI) substrate, a germanium-on-insulator (GOI) substrate, or a SiGe-on-insulator substrate.

The gate 112 may be biased by a voltage to induce a conductive pathway within the active region to enable the drifting of electric charges between the source electrode 114 and the drain electrode 116. In some embodiments, the gate 112 may include a metallic material such as, but not limited to, tungsten, cobalt, nickel, copper, and aluminum.

The conductance of the active region 110 may be controlled by the amount of voltage applied to the gate 112. The active region 110 may have various structural configurations depending on the desired type of transistor. In the representative embodiments, the active region 110 may include a heterostructure having multiple layers of materials. Alternatively, in other embodiments (not shown), the active region 110 may be structured as a single doped layer to enable the drifting of charges across the source electrode 114 and the drain electrode 116.

As shown in FIG. 1A, the active region 110 may include a barrier layer 108 disposed upon a channel layer 106. The channel layer 106 may include one or more sub-layers with a desired band gap. The sub-layers may be doped or undoped. The channel layer 106 may include a Group III-V compound, such as, but not limited to, GaAs, indium gallium arsenide (InGaAs), or GaN. In some embodiments, the channel layer 106 may include the same material as the substrate 102. Alternatively, in other embodiments, the channel layer 106 may include a material different than the material in the substrate 102.

The barrier layer 108 has a band gap that is different from the band gap of the channel layer 106. The barrier layer 108 may include one or more sub-layers and may be doped or undoped. The barrier layer 108 may include a Group III-V compound, such as, but not limited to, aluminum gallium arsenide (AlGaAs), or aluminum gallium nitride (AlGaN).

A heterojunction may be formed at the interface between the barrier layer 108 and the channel layer 106, resulting in the formation of a two-dimensional electron gas (2DEG) 138 in the channel layer 106, which can provide the conductive pathway for the drifting of charges between the source electrode 114 and the drain electrode 116. For example, the barrier layer 108 and the channel layer 106 may be substantially undoped, and the 2DEG 138 may be induced by polarization mismatches between the barrier layer 108 and the channel layer 106. In this example, the barrier layer 108 and the channel layer 106 may both be Group III-Nitride compounds, such as, but not limited to, GaN and AlGaN. In another example, the barrier layer 108 may be more highly doped than the channel layer 106, which forms the 2DEG layer 138.

The gate 112 may be disposed above the channel layer 106 such that a lower surface of the gate 112 is spaced apart from an upper surface of the channel layer 106 by a distance T, in which the distance T may be between zero to a thickness of the barrier layer 108. For example, the gate 112 may be disposed upon the barrier layer 108, in which the distance T equals the thickness of the barrier layer 108. In another example, the barrier layer 108 may be partially recessed and a lower portion of the gate 112 may be disposed within the recessed portion of the barrier layer 108. In yet another example, the gate 112 may be disposed upon the channel layer 106 through an opening defined in the barrier layer 108 such that the distance T equals zero.

The source electrode 114 and the drain electrode 116 may contact the active region 110 in various configurations. As shown in FIG. 1A, the source electrode 114 and the drain electrode 116 may contact the channel layer 106 through the barrier layer 108 such that an electric current may flow between the source electrode 114 and the drain electrode 116 when the gate 112 is biased by a voltage. In other embodiments (not shown), the source electrode 114 and the drain electrode 116 may directly contact the barrier layer 108, and form an electrical connection with the channel layer 106 through a diffusion-based thermal process.

A transition layer 104 may be formed between the channel layer 106 and the substrate 102. The transition layer 104 may serve to accommodate the lattice mismatch between the channel layer 106 and the substrate 102, and thereby improving the "on" state and "off" state electrical characteristics of the device while accommodating bowing, warping, breakage or cracks of the substrate 102. The transition layer 104 may be a superlattice structure with multiple sub-layers, or alternatively, be structured as a single layer. In some embodiments, the transition layer 104 may include AlN, AlGaN, or GaN.

Dielectric layers 124, 126 may be disposed above the active region 110. The dielectric layers 124, 126 may be an inter-metal dielectric (IMD) layer or a "metallization level" that embeds various interconnect features. The dielectric layer 124, 126 may include silicon nitride, silicon dioxide, tetraethyl orthosilicate (TEOS), or a material having a chemical composition of $SiC_xO_yH_z$, wherein x, y, and z are in stoichiometric ratio.

A capping layer 122 may be disposed between the barrier layer 108 and the dielectric layer 124. The capping layer 122 may reduce the reverse current leakage from the active region 110 to the gate 112, and increase the electric field strength in the barrier layer 108 when the device is in the "off" state. In some embodiments, the capping layer 122 may include AlN, AlGaN, or GaN.

Referring again to FIG. 1A, the first field plate 118 and the second field plate 120 are arranged symmetrically around the gate 112. In particular, the gate 112 may be equidistant and laterally spaced apart from the first field plate 118 and the second field plate 120 by a distance D. The distance D may vary depending on design requirements. The first field plate 118 and the second field plate 120 may be formed in the same dielectric layer (e.g., dielectric layer 126) and may have upper surfaces that are substantially coplanar with an upper surface of the gate 112. The first field plate 118 and the second field plate 120 may include the same material as the gate 112. Alternatively, the first field plate 118 and the second field plate 120 may include the same material as the source electrode 114 and the drain electrode 116. In other embodiments, first field plate 118 and the second field plate 120 may include other metallic materials such as, but not limited to, gold (Au), titanium (Ti), nickel-gold (Ni—Au), or titanium-platinum-gold (Ti/Pt/Au).

Unwanted capacitances may exist between the gate 112 and the drain electrode 116 (i.e., gate-to-drain capacitance) and between the gate 112 and the source electrode 114 (i.e., gate-to-source capacitance). The positioning of the first field plate 118 between the source electrode 114 and the gate 112 may reduce the gate-to-source capacitance while the positioning of the second field plate 120 between the drain electrode 116 and the gate 112 may reduce the gate-to-drain capacitance. The reduction of the gate-to-source and gate-to-drain capacitances by the respective first 118 and second 120 field plates and the arrangement of the gate 112 to be equidistant from the first field plate 118 and the second field plate 120 may achieve greater linearity and efficient power consumption of the device. For example, for radio frequency applications, the symmetric arrangement of the first field plate 118 and the second field plate 120 around the gate 112 may advantageously reduce undesirable harmonics generation and intermodulation distortion, as well as a reduced "off" state capacitance. A reduced "off" state capacitance may provide improved signal blocking capabilities when the device is in the "off" state.

In some embodiments, the device may be configured as a bi-directional switch. For high power applications, bi-directional switches may require a high breakdown voltage to sustain high voltages to the source/drain electrodes of the transistor. Advantageously, the symmetric arrangement of the first field plate 118 and the second field plate 120 around the gate 112 may reduce the surface electric field in the region between the gate 112 and the source electrode 114, as well as the region between the gate 112 and the drain electrode 116. Accordingly, the device can achieve a higher breakdown voltage between the source electrode 114 and the drain electrode 116 without experiencing large gate-to-source and gate-to-drain capacitances, and therefore enables the device to handle large power loads.

Moreover, with reduced gate-to-source and gate-to-drain capacitances, the device can achieve shorter switching time between the "on" and "off" states. A shorter switching time can lead to lower power dissipation during the switching of the device, and the switching frequency can be further increased.

Although the embodiment shown is symmetrically configured so that it can enable bi-directional switching, it should be understood that a unidirectional switching could also apply to the present disclosure.

The first field plate 118 may be laterally spaced apart from the source electrode 114, and the second field plate 120 may be laterally spaced apart from the drain electrode 116. As shown in the representative embodiments, both of the first field plate 118 and the second field plate 120 may be conductively isolated (i.e., unbiased by a voltage and configured to float). Alternatively, in other embodiments (not shown), the first field plate 118 and the second field plate 120 may be individually biased by a voltage. The voltage may be either a constant voltage or a variable voltage. In particular, the first field plate 118 and the second field plate 120 may be configured to be biased by the same voltage, or alternatively, the first field plate 118 and the second field plate 120 may be configured by different voltages.

In some embodiments, the first field plate 118 may be electrically coupled to the source electrode 114 and the second field plate 120 may be electrically coupled to the drain electrode 116. Resistors may be used to couple the first field plate 118 with the source electrode 114, as well as the second field plate 120 with the drain electrode 116.

Figure 1B:
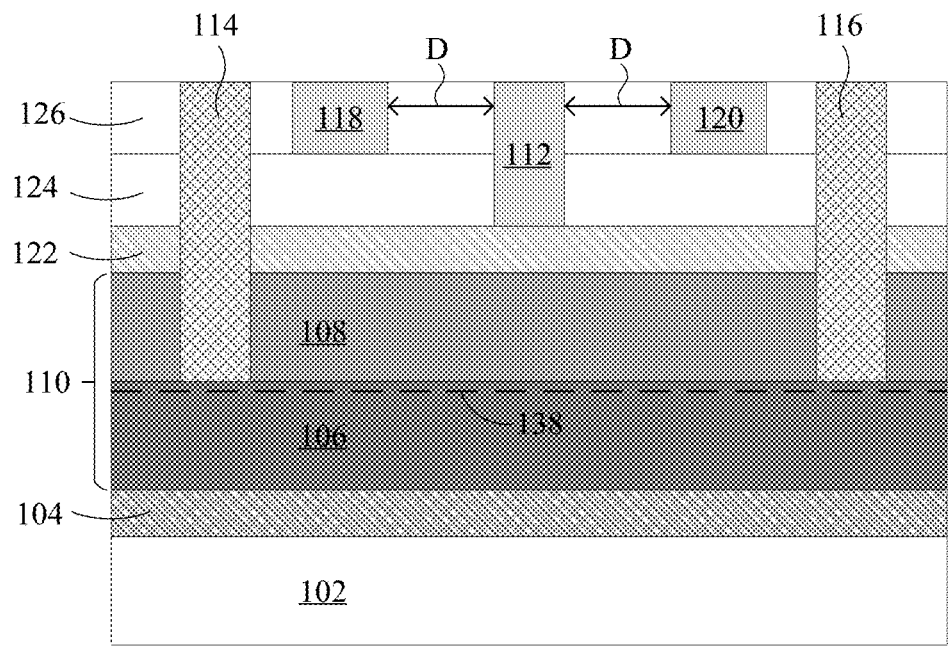

Referring to FIG. 1B, in which like reference numerals refer to like features in FIG. 1A, another embodiment of a semiconductor device is shown. The embodiment shown in FIG. 1B is similar to the embodiment shown in FIG. 1A except that in FIG. 1B, the gate 112 is disposed on the capping layer 122. In this embodiment, the capping layer 122 may be configured as an electrical insulator for the gate 112 to modulate the conductance of the active region 110. Additionally, the capping layer 122 may also reduce the reverse current leakage from the active region 110 to the gate 112, and increase the electric field strength in the barrier layer 108 when the device is in the "off" state.

Figure 1C:
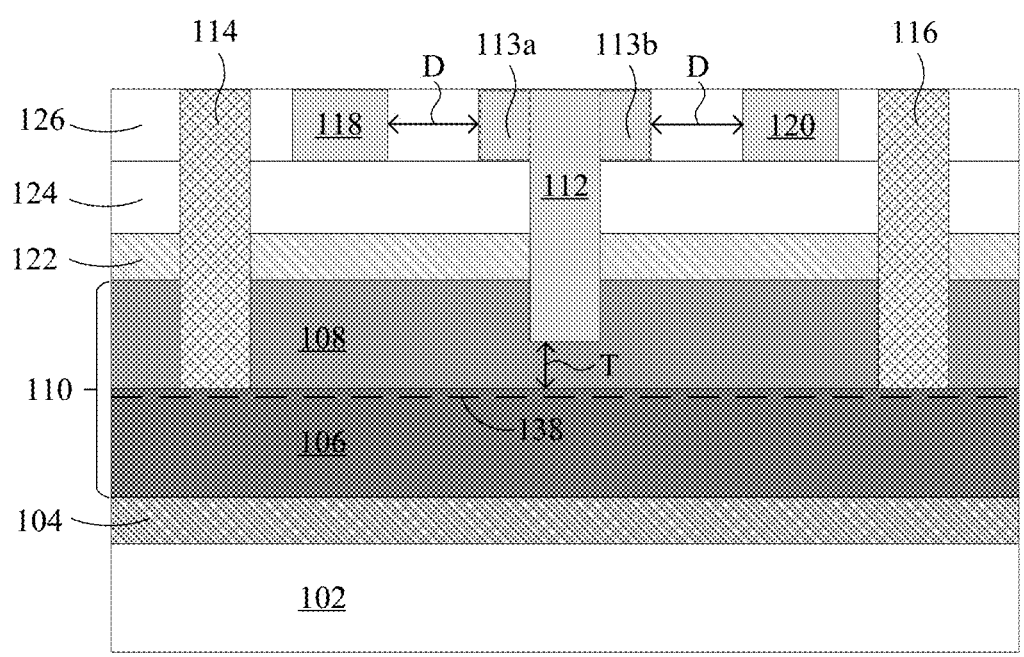

Referring to FIG. 1C, in which like reference numerals refer to like features in FIG. 1A, another embodiment of a semiconductor device is shown. The gate 112 may have field plate extensions 113a, 113b that extend laterally from the gate 112 towards the source 114 and drain 116 electrodes.

The field plate extensions 113a, 113b may have upper surfaces that are substantially coplanar with the upper surfaces of the first field plate 118 and the second field plate 120. The field plate extensions 113a, 113b may be integrally formed with the gate 112, and may be referred to as a "T-shaped" gate. The inclusion of the field plate extensions 113a, 113b may increase the breakdown voltage of the device.

As shown, the field plate extensions 113a, 113b are structured symmetrically around the gate 112. In particular, the field plate extensions 113a, 113b may have identical lengths of extension from lateral sides of the gate 112. The gate 112 and its field plate extensions 113a, 113b are positioned equidistant from the source electrode 114 and the drain electrode 116. For example, the field plate extensions 113a, 113b may be laterally spaced apart from the source electrode 114 and the drain electrode 116, respectively, by a distance D.

Figure 1D:
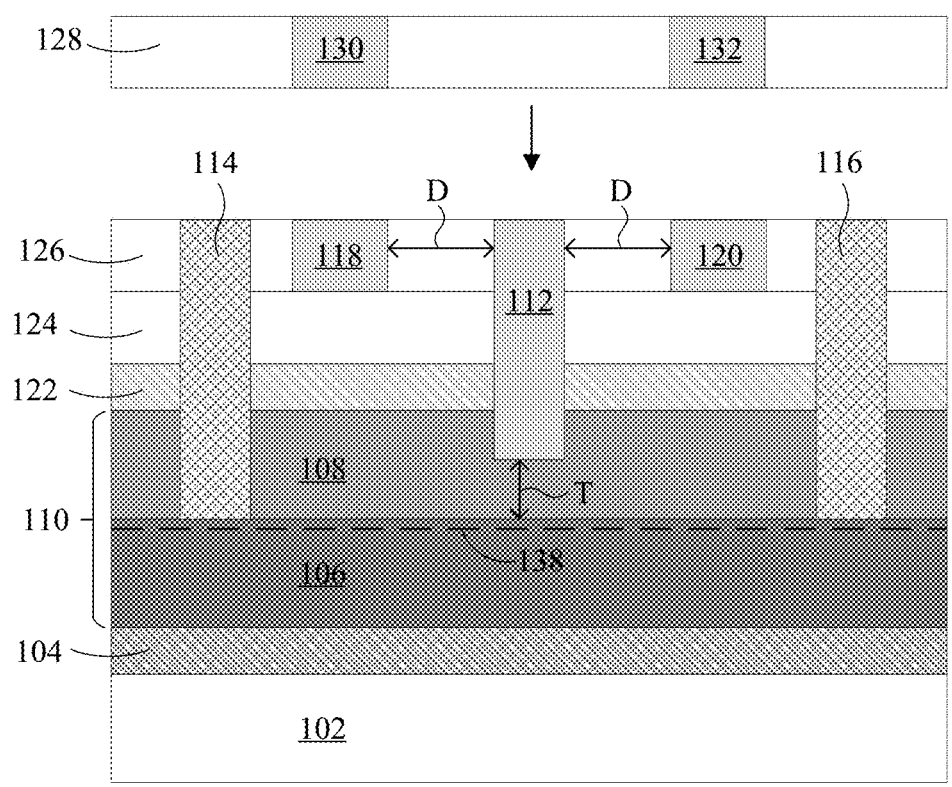

Referring to FIG. 1D, in which like reference numerals refer to like features in FIG. 1A, another embodiment of a semiconductor device is shown. Additional field plates may be formed above the first field plate 118 and the second field plate 120. For example, a third field plate 130 and a fourth field plate 132 may be formed within a dielectric layer 128. The dielectric layer 128 may be an additional inter-metal dielectric (IMD) layer or a "metallization level" that is deposited vertically above the dielectric layer 126. The third field plate 130 and the fourth field plate 132 may be positioned symmetrically around the gate 112 (i.e., being equidistant from the gate 112). Positioning additional field plates above the first field plate 118 and the second field plate 120 may offer an advantage of further reducing the capacitance and the surface electric field in the regions between the gate 112 and the source electrode 114, and the gate 112 and the drain electrode 116, which may lead to further increases in linearity and more efficient power consumption.

Figure 1E:
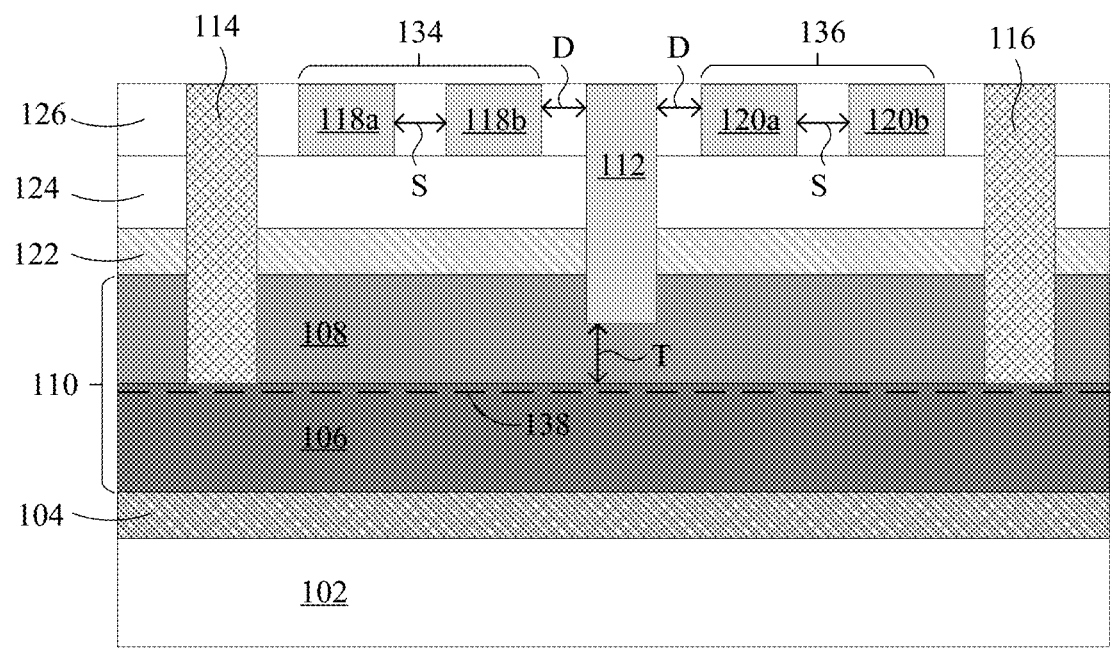

Referring to FIG. 1E, in which like reference numerals refer to like features in FIG. 1A, another embodiment of a semiconductor device is shown. The embodiment in FIG. 1E may include a first set of field plates 134 and a second set of field plates 136. The first set of field plates 134 may be positioned between the source electrode 114 and the gate 112, while the second set of field plates 136 may be positioned between the drain electrode 116 and the gate 112. The first set of field plates 134 and the second set of field plates 136 may be symmetrically arranged around the gate 112. For example, the gate 112 may be equidistant and laterally spaced apart from the first set of field plates 134 and the second set of field plates 136 by a distance D.

The first set of field plates 134 and the second set of field plates 136 may include multiple field plates. The field plates 118a, 118b in the first set 134 and the field plates 120a, 120b in the second set 136 may have upper surfaces that are substantially coplanar with an upper surface of the gate 112. In particular, the number of field plates in the first set 134 may be identical to the number of field plates in the second set 136. Each field plate 118a, 118b in the first set 134 and each field plate 120a, 120b in the second set 136 may be spaced apart from one another by a spacing S. In particular, the spacing between each field plate in the first set 134 may be identical to the spacing between each field plate in the second set 136.

The symmetrical arrangement of multiple field plates around the gate 112 may further reduce the capacitance and the surface electric field in the regions between the gate 112 and the source electrode 114, and the gate 112 and the drain electrode 116, which may lead to further increases in linearity and more efficient power consumption.

Although not shown, it should be understood that the scope of the present disclosure also contemplates modifications of the embodiment in FIG. 1E that has a "T-shaped" gate as described in FIG. 1B.

Figure 1F:
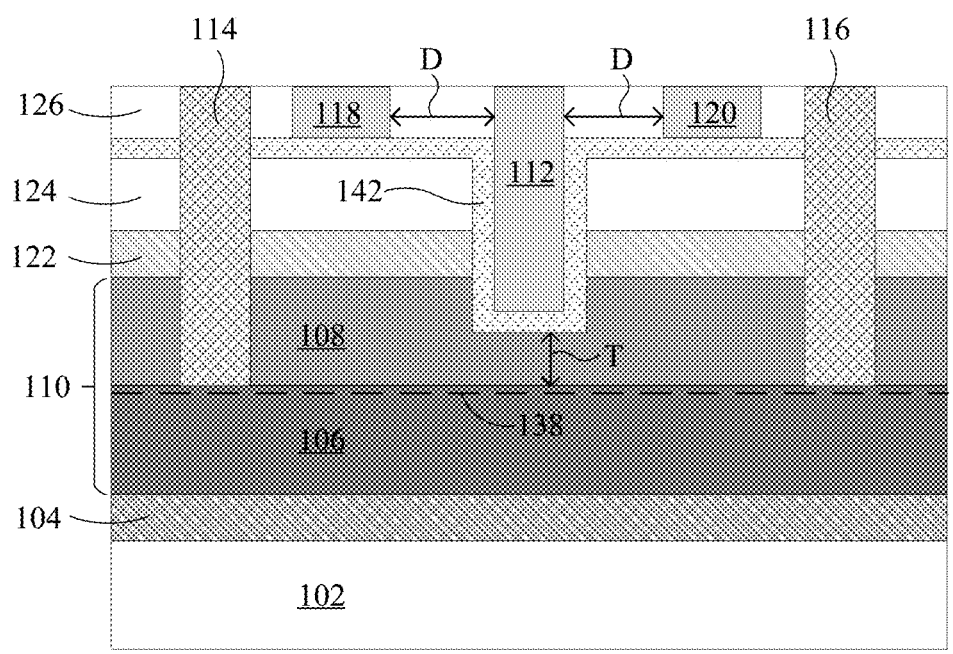

FIG. 1F illustrates another embodiment of the semiconductor device. The embodiment shown in FIG. 1F is similar to the embodiment shown in FIG. 1A except that in FIG. 1F, the gate 112 may be configured over a gate dielectric layer 142. As shown in FIG. 1F, the gate 112 and the gate dielectric layer 142 may be disposed above the channel layer 106 such that the gate dielectric layer 142 is spaced apart from an upper surface of the channel layer 106 by a distance T, in which the distance T may be between zero to a thickness of the barrier layer 108. For example, the gate dielectric layer 142 may be disposed upon the upper surface of the channel layer 106 such that the distance T is zero. In another example, the gate dielectric layer 142 may be disposed upon an upper surface of the barrier layer 108 such that the distance T is equal to the thickness of the barrier layer 108.

Also shown in FIG. 1F, the gate dielectric layer 142 may extend over the dielectric layer 124. The first field plate 118 and the second field plate 120 may be disposed on the gate dielectric layer 142.

The gate dielectric layer 142 may include silicon dioxide ($SiO_2$), a high-k dielectric material, silicon oxynitride, other suitable materials, or combinations thereof. The high-k dielectric material may have a dielectric constant (i.e., K value) that is greater than 5, preferably between 20 to 30. Examples of the high-k dielectric material may include, but not limited to, metal oxides, metal nitrides, metal silicates, transition metal oxides, transition metal nitrides, transition metal silicates, oxynitrides of metals, metal aluminates, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide (LaAlO3), yttrium oxide ($Y_2O_3$), zirconium silicate, zirconium aluminate, or combinations thereof.

FIG. 2 through FIG. 5 show a set of steps that may be used to create the semiconductor devices as provided for in embodiments of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure or opening. Examples of techniques for patterning include, but not limited to, wet etch lithographic processes, dry etch lithographic processes or direct patterning processes. Such techniques may use mask sets and mask layers.

Figure 2:
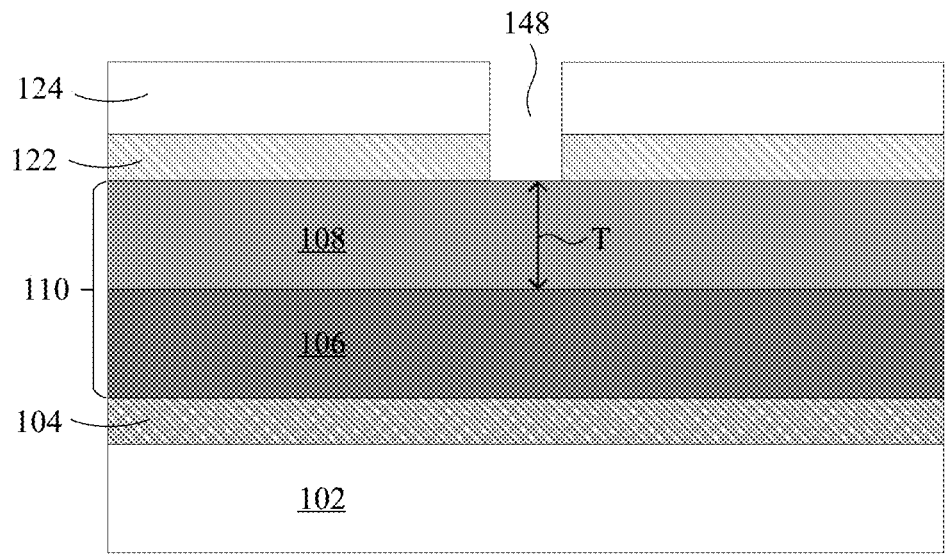
FIG. 2 through FIG. 5 are cross-sectional views depicting various stages of forming a semiconductor device, in accordance with embodiments of the present disclosure.

Referring to FIG. 2, a device structure for use in fabricating the semiconductor devices of the present disclosure is shown. There is provided an active region 110 above a substrate 102. A capping layer 122 may be provided upon the active region 110. The active region 110 may include a barrier layer 108 disposed on a channel layer 106. The capping layer 122 may be disposed upon the barrier layer 108. A first dielectric layer 124 may be deposited on the capping layer 122 using deposition techniques as described herein. The first dielectric layer 124 and the capping layer 122 may be patterned to define an opening 148 using patterning techniques as described herein. In particular, an etching process to form the opening 148 may be stopped such that a lower surface of the opening 148 is spaced apart from an upper surface of the channel layer 106 by a distance T, in which the distance T may be between zero to a thickness of the barrier layer 108. In an embodiment, the opening 148 may expose the barrier layer 108. In another embodiment (not shown), the opening 148 may expose the channel layer 106 by etching through the barrier layer 108.

Figure 3:
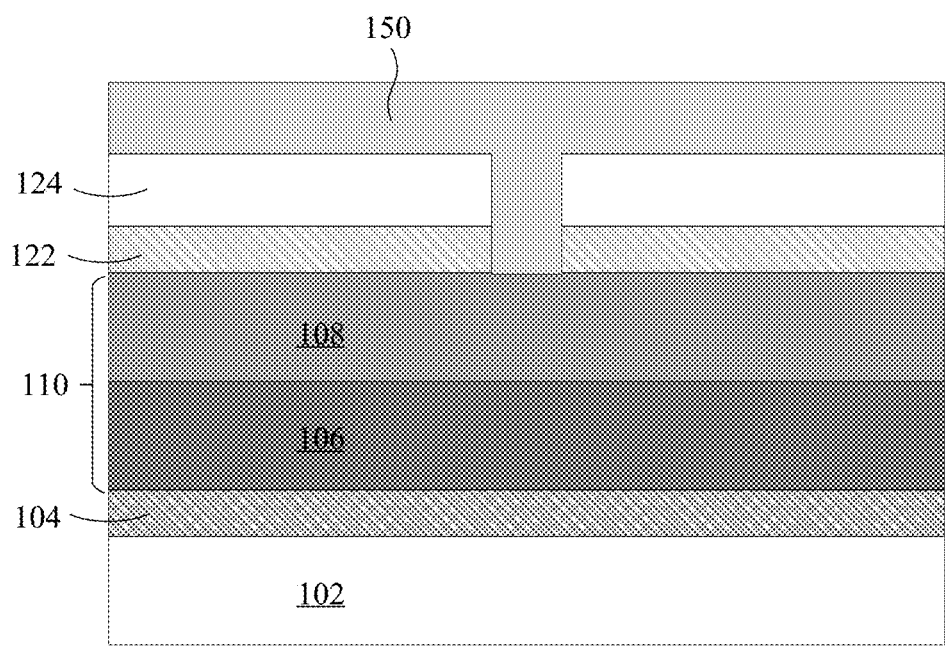

FIG. 3 illustrates the formation of a metal layer 150 above the active region 110. The metal layer 150 may be deposited on the first dielectric layer 124 using the deposition techniques described herein. The deposited metal layer 150 also fills the opening 148. To form the embodiment shown in FIG. 1E, a gate dielectric layer may be deposited in the opening 148 and on the first dielectric layer 124 before depositing the metal layer 150.

Figure 4:
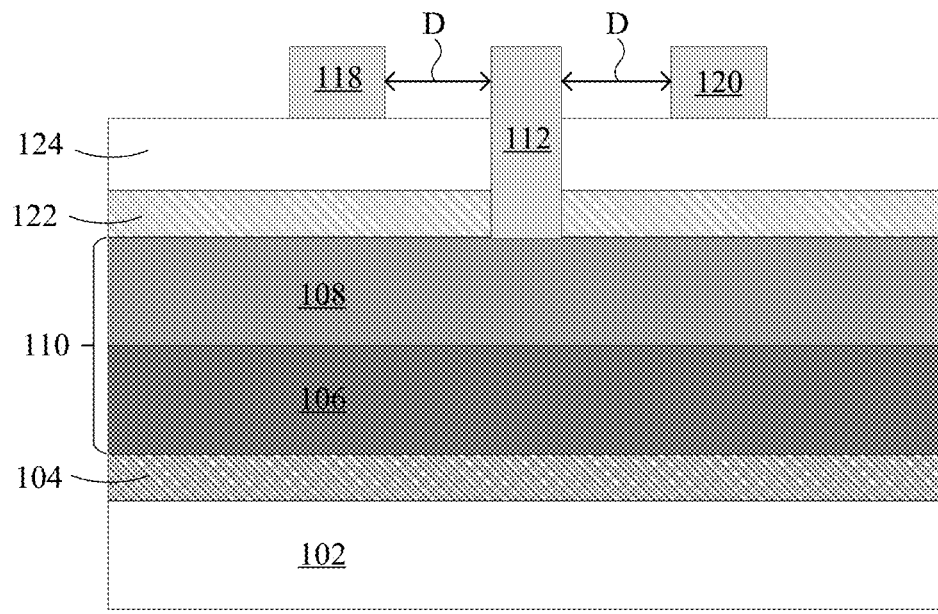

FIG. 4 illustrates the formation a gate 112, a first field plate 118, and a second field plate 120. For example, the metal layer 150 may be patterned using the patterning techniques described herein to form the gate 112, the first field plate 118 and the second field plate 120. In some embodiments, the gate 112 may form a Schottky contact with the active region 110. After patterning the metal layer 150, the first field plate 118 and the second field plate 120 may have upper surfaces that are substantially coplanar with an upper surface of the gate 112. The patterning of the metal layer 150 also ensures that the first field plate 118 and the second field plate 120 are spaced apart from the gate 112 by a distance D. The metal layer 150 may also be patterned to form the "T-shaped" gate, as described in FIG. 1B. Additionally, the patterning of the metal layer 150 may also form a first set of field plates and a second set of field plates, as described in FIG. 1D.

Advantageously, by having the upper surfaces of the first field plate 118 and the second field plate 120 to be substantially coplanar with the upper surface of the gate 112, the fabrication of the first field plate 118 and the second field plate 120 does not require an additional mask (or reticle) and/or additional processes, such as deposition and etching of materials, which reduces fabrication costs. For example, the first field plate 118 and the second field plate 120 can be formed using the same mask that is being used to form the gate 112

Figure 5:
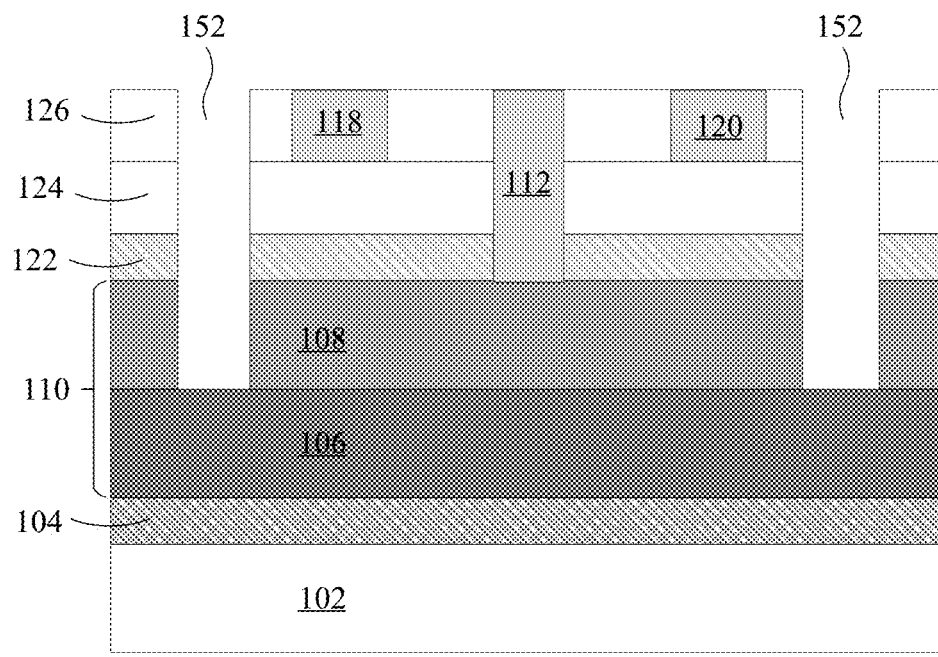

Referring to FIG. 5, a second dielectric layer 126 may be deposited on the first dielectric layer 124 using the deposition techniques described herein. The deposited dielectric layer 126 may fill the distance D between the first field plate 118 and the gate 112, and between the second field plate 120 and the gate 112. Thereafter, source/drain openings 152 are formed by etching through the dielectric layers 124, 126, the capping layer 122, and the barrier layer 108. Source and drain electrodes are subsequently formed by filling the source/drain openings 152 with a metallic material such as, but not limited to, tungsten, cobalt, nickel, copper, and aluminum. In some embodiments, the source and drain electrodes may form ohmic contacts with the active region 110.

The semiconductor devices of the present disclosure may include transistors suitable for use in microwave or millimeter-wave power amplification applications as well as radio frequency applications. The semiconductor devices of the present disclosure may also be capable of handling frequencies in the magnitude of 1-100 gigahertz, as well as voltages in the magnitude of 1.2-600 volts. Examples of such transistors may include, but not limited to, a high electron mobility transistor (HEMT) (e.g., an aluminum gallium nitride (AlGaN)/gallium nitride (GaN) HEMT), a pseudomorphic HEMT (PHEMT) (e.g., a gallium arsenide (GaAs) PHEMT), a metamorphic HEMT (mHEMT) (e.g., a GaAs mHEMT), a laterally diffused metal oxide semiconductor transistor (LDMOS), a metal oxide semiconductor field effect transistor (MOSFET), a metal insulator semiconductor high electron mobility transistor (MISHEMT), or a metal epitaxial semiconductor field effect transistor (MESFET).

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many processes are only mentioned briefly herein or omitted entirely without providing the well-known process details.

As will be readily apparent to those skilled in the art upon a complete reading of the present application, the disclosed semiconductor devices and methods of forming the same may be employed in manufacturing a variety of different integrated circuit products, including, but not limited to, high power electronic devices, communication devices, high electron mobility transistors, etc.

What is claimed is:

1. A semiconductor device comprising:
    an active region above a substrate;
    source and drain electrodes in contact with the active region;
    a gate above the active region and laterally between the source and drain electrodes;
    a first field plate between the source electrode and the gate;
    a second field plate between the drain electrode and the gate;
    wherein the gate is spaced apart laterally and substantially equidistant from the first field plate and the second field plate; and
    wherein the first field plate and the second field plate are conductively isolated.

2. The device of claim 1, wherein the first field plate and the second field plate have upper surfaces that are substantially coplanar with an upper surface of the gate.

3. The device of claim 2, wherein the first field plate is laterally spaced apart from the source electrode, and the second field plate is laterally spaced apart from the drain electrode.

4. The device of claim 2, wherein the gate comprises field plate extensions that extend laterally from the gate towards the source and drain electrodes.

5. The device of claim 4, wherein the field plate extensions are structured symmetrically around the gate.

6. The device of claim 5, wherein the field plate extensions are spaced apart laterally from the first field plate and the second field plate.

7. The device of claim 6, wherein the field plate extensions have upper surfaces that are substantially coplanar with the upper surfaces of the first field plate and the second field plate.

8. The device of claim 2, wherein the active region comprises a barrier layer disposed on a channel layer.

9. The device of claim 8, further comprising a gate dielectric layer above the channel layer, wherein the gate is disposed on the gate dielectric layer and the gate dielectric layer is spaced apart from an upper surface of the channel layer by a distance between zero to a thickness of the barrier layer.

10. The device of claim 8, wherein the gate is disposed above the channel layer, and a lower surface of the gate is spaced apart from an upper surface of the channel layer by a distance between zero to a thickness of the barrier layer.

11. The device of claim 8, further comprising a capping layer upon the barrier layer, wherein the gate is disposed on the capping layer.

12. The device of claim 1, wherein the first field plate and the second field plate are formed in a first dielectric layer, and further comprising:
    a second dielectric layer above the first dielectric layer;
    a third field plate and a fourth field plate formed in the second dielectric layer, wherein the third field plate and the fourth field plate are positioned symmetrically around the gate.

13. A method of forming a semiconductor device comprising:
    forming an active region above a substrate;
    forming a gate above the active region, a first field plate, and a second field plate, the gate being spaced apart laterally and substantially equidistant from the first field plate and the second field plate; and
    forming source and drain electrodes to contact the active region, the gate being laterally between the source and drain electrodes, wherein the first field plate is between the source electrode and the gate, and the second field plate is between the drain electrode and the gate, and wherein the first field plate and the second field plate are conductively isolated.

14. A semiconductor device comprising:
    an active region above a substrate;
    source and drain electrodes in contact with the active region;
    a gate above the active region and laterally between the source and drain electrodes;

a first field plate between the source electrode and the gate;

a second field plate between the drain electrode and the gate;

wherein the gate is spaced apart laterally and substantially equidistant from the first field plate and the second field plate; and wherein the first field plate is electrically coupled to the source electrode and the second field plate is electrically coupled to the drain electrode.

15. The device of claim 14, wherein the first field plate and the second field plate have upper surfaces that are substantially coplanar with an upper surface of the gate.

16. The device of claim 15, wherein the first field plate is laterally spaced apart from the source electrode, and the second field plate is laterally spaced apart from the drain electrode.

17. The device of claim 14, wherein the gate comprises field plate extensions that extend laterally from the gate towards the source and drain electrodes.

18. The device of claim 17, wherein the field plate extensions are structured symmetrically around the gate.

19. The device of claim 18, wherein the field plate extensions are spaced apart laterally from the first field plate and the second field plate.

20. The device of claim 19, wherein the field plate extensions have upper surfaces that are substantially coplanar with the upper surfaces of the first field plate and the second field plate.

\* \* \* \* \*